United States Patent … (10) Patent No.: US 8,815,738 B2
Hsu et al. … (45) Date of Patent: Aug. 26, 2014

(54) SALICIDE PROCESS

(75) Inventors: Chia-Chang Hsu, Kaohsiung (TW);
Bor-Shyang Liao, Kaohsiung (TW);
Kuo-Chih Lai, Tainan (TW); Nien-Ting Ho, Tainan (TW); Chi-Mao Hsu, Tainan (TW); Shu-Min Huang, Tainan (TW); Min-Chung Cheng, Chiayi County (TW)

(73) Assignee: United Microelectronics Corp., Hsinchu (TW)

( * ) Notice: Subject to any disclaimer, the term of this patent is extended or adjusted under 35 U.S.C. 154(b) by 3 days.

(21) Appl. No.: 13/545,736

(22) Filed: Jul. 10, 2012

(65) Prior Publication Data

US 2014/0017888 A1 Jan. 16, 2014

(51) Int. Cl.
*H01L 21/263* (2006.01)

(52) U.S. Cl.
USPC .................................. 438/664; 257/E21.333

(58) Field of Classification Search
USPC .................................................. 438/664, 663
See application file for complete search history.

(56) References Cited

U.S. PATENT DOCUMENTS

| 7,943,499 | B2 * | 5/2011 | Lu et al. | 438/581 |
| 8,383,513 | B2 * | 2/2013 | Tsai et al. | 438/663 |
| 2007/0166974 | A1 * | 7/2007 | Uchino et al. | 438/592 |
| 2008/0191286 | A1 * | 8/2008 | Chang et al. | 257/369 |

* cited by examiner

*Primary Examiner* — Zandra Smith
*Assistant Examiner* — Damian A Hillman
(74) *Attorney, Agent, or Firm* — J.C. Patents

(57) ABSTRACT

A salicide process is described. A substrate having thereon an insulating layer and a silicon-based region is provided. A nickel-containing metal layer is formed on the substrate. A first anneal process is performed to form a nickel-rich silicide layer on the silicon-based region. The remaining nickel-containing metal layer is stripped. A thermal recovery process is performed at a temperature of 150-250° C. for a period longer than 5 minutes. A second anneal process is performed to change the phase of the nickel-rich silicide layer and form a low-resistivity mononickel silicide layer.

12 Claims, 2 Drawing Sheets

SALICIDE PROCESS

BACKGROUND OF THE INVENTION

1. Field of Invention

This invention relates to a salicide (self-aligned silicide) process.

2. Description of Related Art

Metal silicide is frequently formed on a silicon-based doped region to serve as a contact layer and/or reduce the sheet resistance (Rs). Particularly, nickel silicide can be formed at an anneal temperature below 400° C. so that the underlying doped region can have a shallow junction, and is therefore quite suitable for semiconductor devices of small dimensions.

In a traditional salicide process for forming a metal silicide, a metal layer is formed on a wafer with Si-based regions, a first anneal process is performed to form a metal silicide phase on the Si-based regions, the remaining metal layer is stripped by a selective wet etching process in which a batch of wafers are treated at the same time, and then a second anneal process is performed to change the phase of the metal silicide layer and form a low-resistivity silicide layer. However, the batch-type stripping process suffers from low throughput and poor defect performance.

To increase the throughput and reduce the defect count, a single-wafer tool that treats a single wafer each time can be used in replacement of the wet batch-type tool. However, the sheet resistance of the resulting nickel silicide layer on $p^+$-doped regions is raised by doing so.

SUMMARY OF THE INVENTION

In view of the foregoing, this invention provides a salicide process capable of providing a high throughput and a reduced defect count without much increasing the sheet resistance (Rs) of the nickel silicide layer formed on $p^+$-doped regions.

The salicide process of this invention is described as follows. A substrate having thereon an insulating layer and a silicon-based region is provided. A nickel-containing metal layer is formed on the substrate. A first anneal process is performed to form a nickel-rich silicide layer on the silicon-based region. The remaining nickel-containing metal layer is stripped. A thermal recovery process is performed at a temperature of 150-250° C. for a period longer than 5 minutes. A second anneal process is then performed to change the phase of the nickel-rich silicide layer and form a mononickel silicide layer.

In some embodiments of the above process, the remaining nickel-containing metal layer is stripped using a single-wafer tool.

In an embodiment, a cap layer is further formed on the nickel-containing metal layer after the nickel-containing metal layer is formed but before the first anneal process is performed. The cap layer is stripped together with the remaining nickel-containing metal layer later.

By combining the thermal recovery process defined above with the stripping of unreacted nickel-containing metal using a single-wafer tool, a high throughput and a reduced defect count can be obtained without much increasing the sheet resistance (Rs) of the nickel silicide formed on $p^+$-doped regions as compared to case of the traditional batch-type stripping.

In order to make the aforementioned and other objects, features and advantages of the present invention comprehensible, a preferred embodiment accompanied with figures is described in detail below.

DESCRIPTION OF EMBODIMENTS

It is noted that the following embodiments are intended to further explain this invention but not to limit the scope thereof. For example, although the nickel silicide layer is formed on the source/drain (S/D) regions of a MOS transistor in the exemplary embodiment described below, it may alternatively be formed on any other silicon-based doped region that requires a low-resistance structure.

Figures 1, 2A, 2B, 2C:
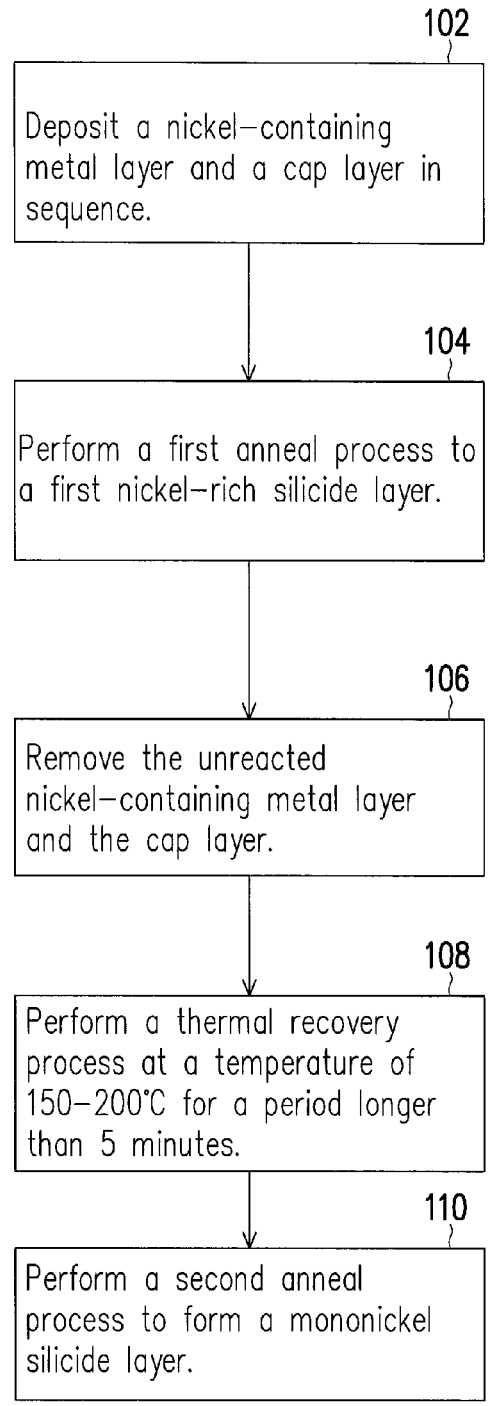
FIG. 1 illustrates a flow chart of a salicide process according to an embodiment of this invention.
FIGS. 2A-2C illustrate, in a cross-sectional view, an exemplary embodiment of the steps 102-106 shown in FIG. 1.

FIG. 1 illustrates a flow chart of a salicide process according to an embodiment of this invention. FIGS. 2A-2C illustrate, in a cross-sectional view, an exemplary embodiment of the steps 102-106 shown in FIG. 1.

Referring to FIG. 1, a nickel-containing metal layer and a cap layer are deposit in sequence in the step 102. For example, as shown in FIG. 2A, a silicon-based substrate 200 having thereon a MOS transistor is provided, wherein the transistor includes a gate 202, a spacer 206 on the sidewall of the gate 202, and S/D regions 208 in the substrate 200 beside the spacer 206. A nickel-containing metal layer 210 and a cap layer 212 are then deposited over the substrate 200 in sequence.

The substrate 200 may be a single-crystal silicon substrate, an epitaxial silicon substrate or a SiGe substrate. The above MOS transistor is a representative of PMOS transistors with $p^+$-doped S/D regions and NMOS transistors with $n^+$-doped S/D regions. The spacer 206 usually includes an insulating material. The nickel-containing metal layer 210 may be a NiPt layer, and may be formed by sputtering. The cap layer 212 may include titanium nitride (TiN) or Ti.

In addition, each S/D region of the above MOS transistor may alternatively have a composite structure that includes a first SiGe layer with a low Ge-content, a second SiGe layer with a high Ge-content in the first SiGe layer, a gradient germanium layer on the first and the second SiGe layers, and a silicon layer on the gradient germanium layer.

In next step 104, a first anneal process is performed to form a nickel-rich silicide layer. For example, as shown in FIG. 2B, a first anneal process is performed to the MOS transistor to form a nickel-rich silicide layer 214 with a first phase, wherein the first phase can be assumed to be based on $Ni_2Si$. The first anneal process may be a rapid thermal process (RTP). The rapid thermal process may be conducted at a temperature of 220-300° C. for a period of 300-30 seconds.

In next step 106, the unreacted NiPt and the cap layer are removed, that is, the remaining NiPt layer and the cap layer are stripped. For example, as shown in FIG. 2C, the remaining NiPt layer 210 and the cap layer 212 over the MOS transistor are stripped. The stripping may use a single-wafer tool for an increased throughput and a reduced defect count. The single-wafer-type stripping may be conducted with SPM (sulfuric peroxide mixture), aqua regia or a HCl-based chemical as an etchant at a temperature of 20-200° C.

In next step 108, a thermal recovery process is performed, at a temperature of 150-250° C. for a period longer than 5 minutes, possibly in the range of 10-50 minutes. The thermal recovery process may utilize a hot plate, an oven or a heater for heating.

In next step 110, a second anneal process is performed to change the phase of the nickel-rich silicide layer and form a mononickel silicide layer with a low resistivity phase. The second phase is known to be NiSi. The second anneal process may be a rapid thermal process (RTP), which may utilize a lamp heater to be conducted at a temperature of 300-700° C. for a period of 30-300 seconds, or alternatively include a laser millisecond spike anneal process, for phase transformation.

Figure 3:
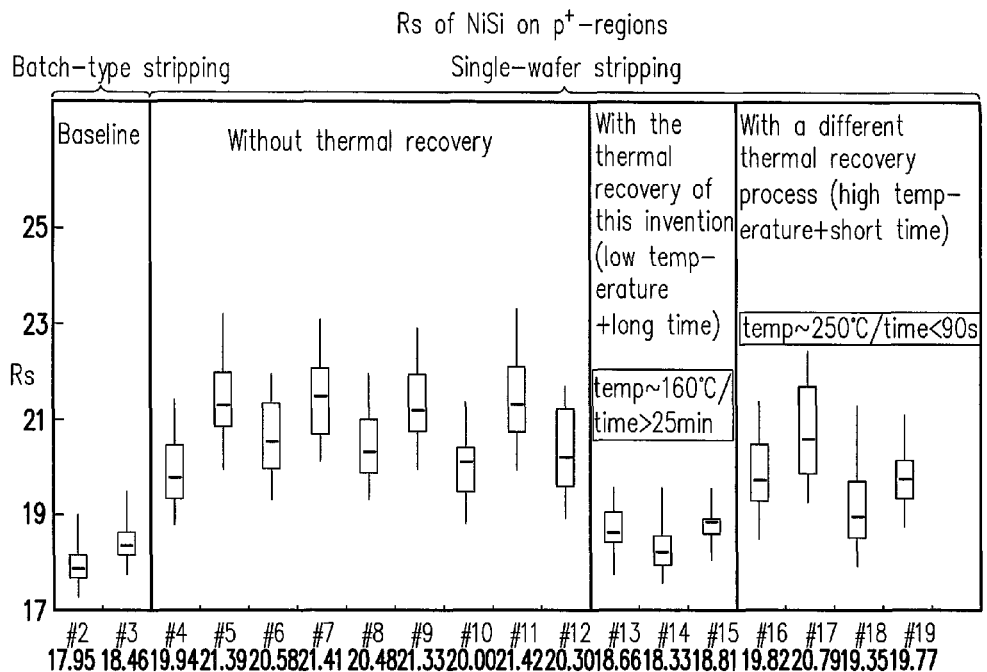
FIG. 3 shows the sheet resistance values of the NiSi layers formed on $p^+$-doped regions in some examples of this invention and in some comparative examples of the cases of the traditional batch-type stripping, the prior-art single-wafer stripping not followed by a thermal recovery, and a single-wafer stripping process followed by a thermal recovery process with a higher temperature (~250° C.) and shorter time (<90 seconds) than the thermal recovery process (~160° C., >25 min) in the examples.

FIG. 3 shows the sheet resistance values of the NiSi layers formed on $p^+$-doped regions in the examples of this invention and in the comparative examples of the cases of the traditional batch-type stripping, the prior-art single-wafer stripping not followed by thermal recovery, and a single-wafer stripping process followed by a thermal recovery process with a higher temperature (~250° C.) and shorter time (<90 seconds) than the thermal recovery process (~160° C., >25 min) in the examples. It is noted that the numbers of "#2" to "#19" represent different wafer samples, and the cases (#2 and #3) of the batch-type stripping are taken for the base line.

Figure 4:
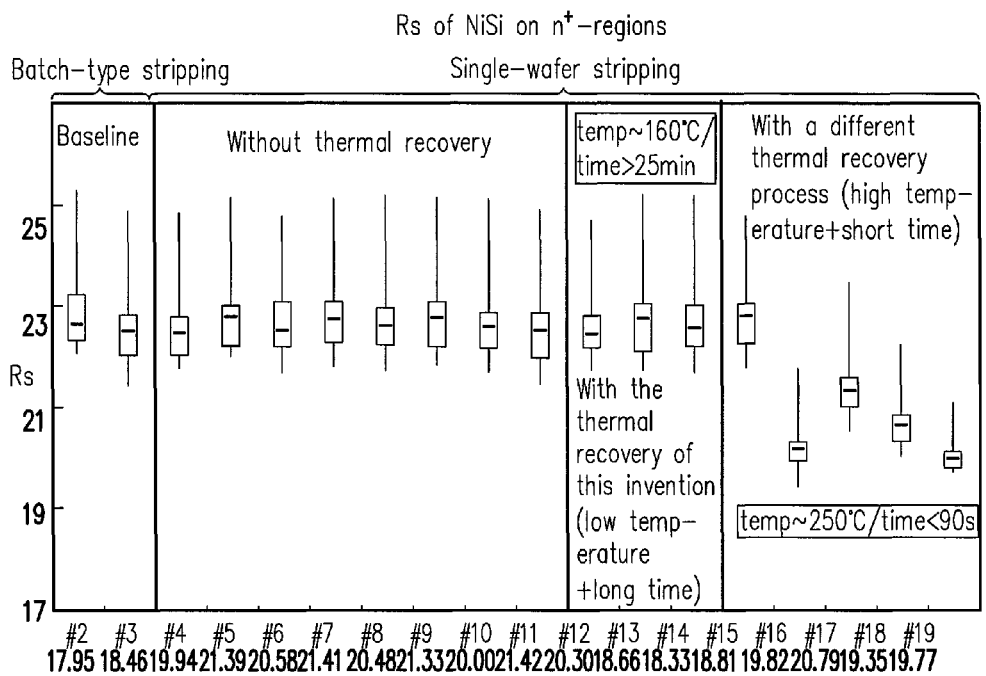
FIG. 4 shows the sheet resistance values of the NiSi layers formed on $n^+$-doped regions in the same examples of this invention and in the same comparative examples.

FIG. 4 shows the sheet resistance values of the NiSi layers formed on $n^+$-doped regions in the same examples of this invention and in the same comparative examples.

In the experiments of all the examples and the comparative examples, the devices to be formed with a NiSi layer were PMOS transistors with a SiGe/Ge/Si S/D structure and NMOS transistors, the nickel-containing metal layer was a NiPt layer, the cap layer formed on the NiPt layer included TiN, the first anneal process was an RTP conducted at about 240° C. for 60 seconds, and the second anneal process was an RTP that used a laser millisecond spike anneal process for heating and was conducted at about 800° C. For the comparative examples with the batch-type stripping, the batch-type stripping was conducted with SPM as an etchant at 150° C. for 1500 seconds. For the examples and the comparative examples with the single-wafer stripping, the stripping was conducted with the same etchant at 150° C. for 130 seconds.

It is clear from FIGS. 3 and 4 that the prior-art single-wafer stripping without subsequent thermal recovery caused the Rs value of the NiSi layer on the $p^+$-doped regions to increase much, as compared to the cases with the batch-type stripping, while combining the different high-temperature (~250° C.) short-time (<90 s) thermal recovery process with single-wafer stripping merely slightly lowered the increased Rs value of the NiSi layer on $p^+$-doped regions but remarkably lowered the Rs value of the NiSi layer on $n^+$-doped regions. However, by combining the low-temperature long-time thermal recovery process of this invention with single-wafer stripping, the increased Rs value of the NiSi layer on $p^+$-doped regions is much lowered to be close to the level in the cases with the batch-type stripping.

Accordingly, by using the salicide process of this invention including long-time thermal recovery and using a single-wafer tool to strip the unreacted nickel-containing metal in the salicide process, a high throughput and a reduced defect count can be obtained without much increasing the sheet resistance (Rs) of the nickel silicide formed on $p^+$-doped regions as compared to case of the traditional batch-type stripping.

This invention has been disclosed above in the preferred embodiments, but is not limited to those. It is known to persons skilled in the art that some modifications and innovations may be made without departing from the spirit and scope of this invention. Hence, the scope of this invention should be defined by the following claims.

What is claimed is:

1. A salicide process, comprising:
   providing a substrate having thereon an insulating layer and a silicon-based region;
   forming a nickel-containing metal layer on the substrate;
   performing a first anneal process to form a nickel-rich silicide layer on the silicon-based region;
   stripping the remaining nickel-containing metal layer with aqua *regia* or a HCl-based chemical as an etchant using a single-wafer tool;
   performing, after the remaining nickel-containing metal layer is stripped, a thermal recovery process at a temperature of 160-250° C. for a period longer than 25 minutes; and
   performing, after the thermal recovery process is performed, a second anneal process to form a mononickel silicide layer.

2. The salicide process of claim 1, wherein the stripping is conducted at a temperature of 150-200° C. for a period of 600-3000 seconds.

3. The salicide process of claim 1, wherein the thermal recovery process utilizes a hot plate, an oven or a heater for heating.

4. The salicide process of claim 1, wherein the nickel-containing metal layer comprises a NiPt layer.

5. The salicide process of claim 1, further comprising:
   forming a cap layer on the nickel-containing metal layer after the nickel-containing metal layer is formed but before the first anneal process is performed; and
   stripping the cap layer together with the remaining nickel-containing metal layer.

6. The salicide process of claim 5, wherein the cap layer comprises TiN or Ti.

7. The salicide process of claim 1, wherein the first anneal process comprises a rapid thermal process (RTP).

8. The salicide process of claim 7, wherein the rapid thermal process is conducted at a temperature of 220-300° C. for a period of 300-30 seconds.

9. The salicide process of claim 1, wherein the second anneal process comprises a rapid thermal process (RTP).

10. The salicide process of claim 9, wherein the rapid thermal process utilizes a lamp heater for heating.

11. The salicide process of claim 10, wherein the rapid thermal process is conducted at a temperature of 300-700° C. for a period of 30-300 seconds.

12. The salicide process of claim 9, wherein the rapid thermal process comprises a laser millisecond spike anneal process.

* * * * *